United States Patent [19]

Uekita et al.

[11] 4,370,191

[45] Jan. 25, 1983

[54] ELECTRICAL LAMINATE

[75] Inventors: Masakazu Uekita; Masaharu Abe, both of Kobe, Japan

[73] Assignee: Kanegafuchi Kagaku Kogyo Kabushiki Kaisha, Osaka, Japan

[21] Appl. No.: 164,512

[22] Filed: Jul. 2, 1980

[51] Int. Cl.³ .............................................. C09J 5/02
[52] U.S. Cl. .................................. 156/307.7; 156/332; 428/481; 428/482; 428/458
[58] Field of Search ............... 428/480, 482, 458, 481; 156/308.2, 332, 307.7

[56] References Cited

U.S. PATENT DOCUMENTS

| | | | |
|---|---|---|---|
| 2,517,698 | 8/1950 | Muskat | 156/247 |
| 2,632,744 | 3/1953 | Howald | 156/247 |
| 3,897,588 | 7/1975 | Nohtomi | 428/436 |
| 3,902,951 | 9/1975 | Doi et al. | 156/313 |
| 4,012,267 | 3/1977 | Klein | 156/178 |
| 4,197,353 | 4/1980 | Tobias et al. | 528/309 |

Primary Examiner—George F. Lesmes
Assistant Examiner—E. Rollins Buffalow
Attorney, Agent, or Firm—Haight & Associates

[57] ABSTRACT

An electrical laminate comprising layers of a resin impregnated fibrous substrate is disclosed. The resin has a glass transition point from about 20° C. to 80° C. and comprises a cured product of a mixture of an unsaturated polyester polymer and a cross-linking monomer. The laminate exhibits an improved punchability at a temperature not lower but not 20° C. higher than the glass transition point of the resin.

4 Claims, No Drawings

ELECTRICAL LAMINATE

This invention relates to a reinforced unsaturated polyester resin laminate for electrical uses. More particularly it relates to an unclad or a metal foil clad, thin, reinforce unsaturated polyester resin laminate of so-called cold punching type having a thickness from 0.5 to 5 mm, particularly 0.8 to 4 mm, and typically from 1.2 to 2.0 mm.

The electrical laminates of this type have been produced by impregnating a fibrous substrate such as paper or glass fiber fabric with a mixture of an unsaturated polyester polymer and a cross-linking monomer, laminating layers of resin-impregnated substrate and curing by a thermal treatment. Metal foil clad laminates, especially copper clad, may be prepared by applying a metal foil onto one or both sides of a laminate prior to or subsequent to the curing step.

These unclad or clad laminates are often trimmed or provided with apertures such as holes or slots by punching at a temperature from room temperature to 80° C. It is, therefore, necessary for electrical laminates to have good machining properties such as punchability in addition to other characteristics required as electrical grade laminates.

Crystalline or solid type unsaturated polyester resins have been conventionally used as the material for making the electrical laminates. These resins require heat and pressure during the laminating step. Experiments have shown, however, that these products are incapable of being punched well at a temperature from room temperature to 80° C., although their anti-thermal properties are satisfactory. When these laminates are punched at a temperature in the above range, cracks, burrs, voids or other surface imperfections are often formed near the punched areas. To avoid this, a higher punching temperature is required which is inconvenient for the economical production of various electrical parts therefrom.

It is an object of the present invention to provide a reinforced unsaturated polyester resin laminate of electrical grade which has a good punching property within the temperature range between 20° C. and 100° C., especially between 30° C. and 80° C.

It is another object of this invention to provide a method for fabricating shaped reinforced unsaturated polyester resin laminates by punching, which method substantially reduces the formation of various surface imperfections near the punched areas.

According to the present invention, an electrical laminate is provided comprising layers of fibrous substrate impregnated with and bonded together by a fully cured resin comprising an unsaturated polyester polymer and a cross-linking monomer. The fully cured resin has a glass transition point from about 20° C. to 80° C. The laminate may be either unclad, or clad with a metal foil onto one or both sides thereof.

The finished electrical laminate may be machined by punching for fabricating various shaped laminates at a temperature not lower than but not 20° C., preferably not 10° C. higher than the glass transition point of the fully cured resin. This punching temperature substantially reduces the possibilities of formation of cracks, burrs, voids or other surface imperfections on the punched laminate.

The term "Glass Transition Point" used herein refers to, as is well-known in the art, a temperature at which a polymeric substance changes from glassy state to rubbery state or vice versa. This characteristic is intrinsic for a given polymeric substance if the molecular weight thereof is sufficiently high and may be easily determined by any known technique, such as dilatometry, calorimetry, dynamic dispersion or change of linear thermal expansion coefficient against temperature. These methods are applicable not only to the resin itself but also to the composite laminate made of the resin and a substrate with equivalent results.

According to the present invention, the cured resin portion of the finished laminate should have a glass transition point from about 20° C. to 80° C., preferably from about 30° C. to 70° C. If the glass transition point is higher than 80° C., undesirable surface imperfections such as cracks, voids or the like may be formed at a punching temperature below that point. If the glass transition point is lower than 20° C., punching at a temperature higher than that point may result in inwardly protruded or tapered or otherwise irregular configurations in the punched holes.

The unsaturated polyester polymer which may be used herein may be prepared by reacting a polyhydric alcohol such as ethyleneglycol, propyleneglycol, diethyleneglycol, 1,4-butanediol and 1,5-pentanediol with an unsaturated polycarboxylic acid and a saturated polycarboxylic acid. Usable examples of unsaturated polycarboxylic acid include maleic anhydride and fumaric acid, and examples of saturated polycarboxylic acid include phthalic anhydride, isophthalic acid, terephthalic acid, adipic acid, sebacic acid, glutaric acid, pimelic acid, succinic acid and azelaic acid. The condensate typically has a recurring unit of the formula:

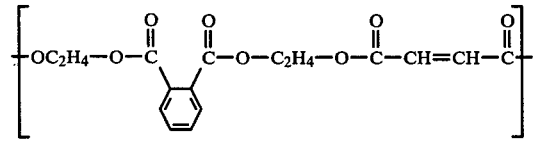

The curable resin composition further comprises a cross-linking monomer such as styrene, vinyltoluene, chlorostyrene, dichlorostyrene, divinylbenzene, vinyl acetate, $C_1$–$C_{10}$ alkyl acrylate such as butyl acrylate, $C_1$–$C_{10}$ alkyl methacrylate, diallylphthalate, triallylcyanurate and mixtures thereof. Styrene or styrene-containing mixtures are preferable.

The characteristics of fully cured resin including the glass transition point may vary with the combinations and proportions of particular starting materials used. For examples a curable composition comprising about 35 parts by weight of styrene and about 65 parts by weight of one of the following unsaturated polyester polymers gives a cured resin having a glass transition point from 20° C. to 80° C.

| Glycol | Sat'd carboxylic acid | Unsat'd carboxylic acid | Molar ratio |
|---|---|---|---|
| Diethyleneglycol | Isophthalic | Maleic | 3:2:1 |
| Propyleneglycol | " | " | 2:1:1 |
| 1,3-butanediol | " | " | 2:1:1 |
| 1,4-butanediol | " | " | 2:1:1 |
| Di- | | | |

-continued

| Glycol | Sat'd carboxylic acid | Unsat'd carboxylic acid | Molar ratio |
|---|---|---|---|
| propyleneglycol | " | " | 2:1:1 |
| Diethyleneglycol | " | " | 2:1:1 |
| Propyleneglycol | Phthalic | " | 2:1:1 |
| Propyleneglycol | Glutaric | " | 2:1:1 |
| Propyleneglycol | Succinic | " | 2:1:1 |
| Propyleneglycol | Pimelic | " | 2:1:1 |
| Propyleneglycol | Adipic | " | 2:1:1 |
| Propyleneglycol | Sebacic | " | 2:1:1 |
| Propyleneglycol | Azelaic | " | 2:1:1 |

A 2:1:1 in molar ratio condensate of propyleneglycol, isophthalic and maleic acids containing 35% of styrene, for example, has a glass transition point of about 70° C.

Other examples of curable resin compositions include mixtures of a 3:1:1 in molar ratio condensate of diethyleneglycol, isophthalic acid and maleic anhydride with styrene and butyl acrylate monomers in proportions set forth in Table I.

TABLE I

|  | Composition A | Composition B | Composition C |
|---|---|---|---|
| Unsaturated polyester polymer | 60% wt. | 60% wt. | 50% wt. |
| Styrene | 35 | 30 | 30 |
| Butyl acrylate | 5 | 10 | 20 |
| Tz | 50° C. | 45° C. | 35° C. |

The curable composition may contain natural or synthetic rubbers such as polybutadiene or maleic acid-modified polybutadiene, plasticizers such as commercially available phthalate or adipate plasticizers, or expoxylated soybean oil, and inorganic fillers such as calcium carbonate, silica or titanium dioxide. These additives may be incorporated into the curable composition for controlling the glass transition point of fully cured resin within the desired range.

The curable composition may also contain a curing catalyst of peroxide type such as cumene hydroperoxide and a co-catalyst such as cobalt naphthenate.

The curable resin composition is preferably in liquid phase at room temperature and has a viscosity from 0.1 to 30 poise, preferably from 0.5 to 10 poise at room temperature.

A variety of fibrous substrates may be used. Usable substrates include papers made of craft pulp or cotton linter pulp, woven or nonwoven fabrics made of glass fiber, asbestos or natural or synthetic fibers. Papers such as kraft paper are preferable. It is highly desirable for these substrates to treat with a pre-impregnating chemical prior to the resin-impregnation step. This pre-impregnation treatment may reduce the moisture pickup of the substrate and thus greatly improves the electrical properties of the finished laminate. Usable pre-impregnating chemicals include methylol group-containing compounds such as those described in a copending application of Yasuo Fushiki et al, Ser. No. 06/143,086, filed Apr. 23, 1980, assigned to the same assignee as the present application. These chemicals are used in the form of a solution or dispersion in a solvent such as water, alcohols, ketones or esters. The substrate may be soaked in or coated with the solution or dispersion and then dried to remove the solvent and volatile by-products.

The final impregnation of the substrate with the curable resin composition and the subsequent steps for laminating and curing may be carried out in any conventional manner without applying pressure as disclosed in a co-pending application of Masana Gotou et al, Ser. No. 06/132,500, filed Mar. 21, 1980, assigned to the same assignee as the present application, to which reference is made as a part of disclosure hereof. The laminate may be also cured by exposing to ionizing radiation or ultraviolet radiation to polymerize the curable resin composition.

If a clad laminate is desired, a cladding metal foil such as electrolytic copper foil may be adhesively bonded onto one or both sides of the laminate prior to or subsequent to the curing step.

The resulting clad or unclad laminate of the present invention exhibits satisfactory punching characteristics at a temperature not lower than but not 20° C. higher than, preferably not 10° C. higher than the glass transition point of the cured resin. The punched laminate is substantially free from undesirable surface inperfections such as cracks, burrs, voids and the like as often experienced in prior art unsaturated polyester resin laminates. The laminate of this invention is generally superior in the punching property even to reinforced phenolic laminates of electrical grade.

To further illustrate the invention the following non-limiting examples are presented wherein all parts and percents are by weight unless otherwise indicated and glass transition points are of those measured using Perkin-Elmer Thermal Physical Tester Model TMS-1.

EXAMPLE 1

An unsaturated polyester resin polymer was prepared by reacting diethyleneglycol, isophthalic acid and maleic anhydride in a molar ratio of 3:2:1. To 63 parts of this resin polymer were added 37 parts of styrene monomer, 1 part of cumene hydroperoxide and 0.2 parts of 6% cobalt naphthenate.

A kraft paper having a basis weight of about 150 g/m$^2$ (MKP-150, Tomoegawa Paper Co., Ltd.) was impregnated with the above resin-monomer mixture and six plies of the impregnated paper were stacked. The resulting stack was then sandwiched between a pair of cellophane sheets of 35 $\mu$m thickness and cured at 100° C. for 40 minutes and then at 85° C. for 12 hours while horizontally supporting between the pair of cellophane sheets. The resulting laminate had a thickness of 1600 $\mu$m. The glass transition point of the cured resin component of this laminate was determined to be about 55° C.

The laminate was then punched at various temperatures using a test die having twenty three punching pins each having a diameter of 1 mm and being spaced from each other by a center-to-center distance of 2.54 mm.

Punchability was evaluated according to ASTM D617-44 with respect to edges, surfaces and holes. The results are shown in Table II.

TABLE II

| Temp. | Edge | Surface | Hole |
|---|---|---|---|
| 30° C. | Fair | Very Good | Very Good |

TABLE II-continued

| Temp. | Edge | Surface | Hole |
|---|---|---|---|
| 50° C. | Good | Very Good | Very Good |
| 60° C. | Very Good | Excellent | Excellent |
| 70° C. | Very Good | Very Good | Very Good |
| 80° C. | Very Good | Very Good | Good |

EXAMPLES 2 AND 3

Example 1 was repeated except that the unsaturated polyester resin polymers set forth in Table III were replaced for the diethyleneglycolisophthalic acid-maleic anhydride condensate of Example 1.

TABLE III

| Example | Unsaturated Polyester Resin Polymer (molar ratio) | | Glass Transition Point |
|---|---|---|---|
| 2 | Phthalic anhydride | 1 | about 30° C. |
|   | Maleic anhydride | 1 | |
|   | Dipropyleneglycol | 2 | |
| 3 | Phthalic anhydride | 1 | about 35° C. |
|   | Maleic anhydride | 1 | |
|   | Diethyleneglycol | 2 | |

The punchability of the resulting laminates were evaluated as in Example 1. The results are shown in Table IV.

TABLE IV

| | Example 2 | | | Example 3 | | |
|---|---|---|---|---|---|---|
| Temp. | Edge | Surface | Hole | Edge | Surface | Hole |
| 30° C. | Very Good | Excellent | Very Good | Good | Very Good | Very Good |
| 40° C. | Ecellent | Excellent | Very Good | Excellent | Excellent | Excellent |
| 50° C. | Very Good | Very Good | Very Good | Very Good | Excellent | Very Good |
| 60° C. | Good | Good | Good | Good | Good | Good |
| 80° C. | Good | Good | Fair | Good | Good | Fair |

EXAMPLES 4 TO 6

Example 1 was repeated except that the unsaturated polyester resin polymer of Example 1 was mixed with styrene monomer and butyl acrylate monomer in a proportion as shown in Table V.

TABLE V

| | Example 4 | Example 5 | Example 6 |
|---|---|---|---|
| Unsaturated Polyester Resin Polymer | 60% | 60% | 50% |
| Styrene | 35 | 30 | 30 |
| Butyl Acrylate | 5 | 10 | 20 |
| Glass Transfer Point | about 50° C. | about 45° C. | about 35° C. |

Each resulting laminate exhibited a punching property ranking from "excellent" to "fair" in every evaluating item according to ASTM D617-44 at a temperature from 30° C. to 80° C. The punching property of the laminate of Example 6 was compared with that of a commercially available paper-reinforced phenolic laminate. The results are shown in Table VI.

TABLE VI

| | Example 6 | | | Commercial Phenolic Laminate | | |
|---|---|---|---|---|---|---|
| Temp. | Edge | Surface | Hole | Edge | Surface | Hole |
| 30° C. | Good | Very Good | Very Good | Fair | Good | Good |
| 40° C. | Excellent | Excellent | Very Good | Good | Good | Good |
| 50° C. | Very Good | Very Good | Very Good | Good | Good | Good |
| 70° C. | Good | Good | Good | Very Good | Very Good | Very Good |

EXAMPLES 7 TO 12

The kraft paper used in Example 1 was impregnated with a polyester resin-monomer mixture of Examples 1 to 6. Six plies of the impregnated paper were stacked. An electrolytic copper foil of 35 μm thick was applied onto one side of the stack and a cellophane sheet of 35 μm thick was applied onto the other side of the stack. The entire structure was than cured as in Example 1 to give a copper clad laminate 1650 μm thick.

Each resulting laminate exhibited a punching property ranking from "excellent" to "fair" in every item according to ASTM D617-44 at a temperature from 30° C. to 80° C.

EXAMPLE 13

Example 1 was repeated except that the various steps thereof were carried out in a continuous manner by curing the laminate at 100° C. for 45 minutes while supporting between a pair of cellophane sheet without applying pressure. After cutting into a suitable size, the laminate was fully cured at 80° C. for 12 hours.

The resulting laminate had a thickness of 1600 μm. The punching property of this laminate was evaluated as before and the results are shown in Table VII.

TABLE VII

| Tempt. | Edge | Surface | Hole |
|---|---|---|---|
| 30° C. | Good | Very Good | Very Good |
| 50° C. | Very Good | Very Good | Very Good |
| 60° C. | Excellent | Excellent | Excellent |
| 70° C. | Very Good | Excellent | Very Good |
| 80° C. | Very Good | Very Good | Good |

REFERENCE EXAMPLES 1 AND 2

Commercial unsaturated polyester resins, one sold under the name of Polyester 6304 from Takeda Chemical Industries, Ltd. (glass transition point of about 90° C.), and the other sold under the name of Rigolac 150 HRN sold from Showa Kobunshi Co., Ltd. (glass transition point of about 120° C.), replaced the unsaturate polyester resin polymer of Example 1 respectively.

Undesirable imperfections were formed by punching at a temperature below 100° C. in case of the former commercial resin, and at a temperature below 140° C. in case of the latter commercial resin.

REFERENCE EXAMPLE 3

Diethyleneglycol, sebacic acid and maleic anhydride were reacted in a molar ratio of 2:1:1. The resulting polymer replaced the unsaturated polyester resin polymer of Example 1. The cured resin component of the resulting laminate had a glass transition point of 0° C.

The punching property of the resulting laminate was evaluated as before at a temperature from 30° C. to 80° C. The punched holes had protrusions or tapered portions on the inner walls.

The above has been offered for illustrative purposes only, and it is not for the purpose of limiting the scope of this invention, which is defined in the claims below.

We claim:

1. In a method for producing an electrical laminate comprising the steps of impregnating a paper substrate with a curable liquid resin consisting essentially of an unsaturated polyester polymer obtained by esterifying a mixture of a saturated polybasic acid component and an unsaturated polybasic acid component with a substantially stoichiometric amount of a polyol component, and a cross-linking vinyl monomer, laminating a plurality of the resin-impregnated substrates, and curing the laminate, the improvement comprising employing as said liquid resin one consisting of said curable resin which is in liquid phase at room temperature, has a viscosity of 0.1–30 poise and, when fully cured, has a glass transition point from about 20° C. to 80° C.

2. The method of claim 1 further comprising the step of adhesively bonding a cladding metal foil onto at least one side of the laminate.

3. The method of claim 1 further comprising the step of punching the laminate at a temperature not lower than but not 20° C. higher than said glass transition point after said curing step.

4. The method of claim 1, wherein said paper is pre-impregnated with a methylol group-containing compound.

* * * * *